United States Patent
Ishii et al.

(10) Patent No.: US 6,888,173 B2
(45) Date of Patent: May 3, 2005

(54) LIGHT EMITTING DIODE DEVICE

(75) Inventors: Hirohiko Ishii, Yamanashi-ken (JP); Koichi Fukasawa, Yamanashi-ken (JP)

(73) Assignee: Citizen Electronics Co, Ltd., Yamanashi-Ken (JP)

( * ) Notice: Subject to any disclaimer, the term of this patent is extended or adjusted under 35 U.S.C. 154(b) by 0 days.

(21) Appl. No.: 10/282,125

(22) Filed: Oct. 29, 2002

(65) Prior Publication Data

US 2003/0089919 A1 May 15, 2003

(30) Foreign Application Priority Data

Nov. 14, 2001 (JP) ........................................ 2001-348275

(51) Int. Cl.[7] ............................ H01L 33/00; H01J 29/10
(52) U.S. Cl. .......................... 257/100; 257/81; 257/89; 257/98; 257/99; 313/467; 313/468; 313/512
(58) Field of Search ...................... 257/81, 89, 98–100, 257/676; 313/512, 467–468, 501–504; 438/26, 28, 29, 34–35; 252/301, 301.6 P, 301.4 R

(56) References Cited

U.S. PATENT DOCUMENTS 6,340,824 B1 * 1/2002 Komoto et al. ................ 257/99
6,521,915 B2 * 2/2003 Odaki et al. ................... 257/98

FOREIGN PATENT DOCUMENTS

JP 2000 208818 7/2000
JP 2001 196645 7/2001

* cited by examiner

Primary Examiner—Donghee Kang
(74) Attorney, Agent, or Firm—Dennison, Schultz, Dougherty & MacDonald

(57) ABSTRACT

An LED is mounted on a substrate, and a protector made of a transparent material is provided for sealing the LED. A color correcting filter is formed on the protector. The color correcting filter has an effect of changing chromaticity of emitted light of the LED to desired chromaticity of illuminating light to be discharged from the LED device.

1 Claim, 9 Drawing Sheets

# US 6,888,173 B2

LIGHT EMITTING DIODE DEVICE

BACKGROUND OF THE INVENTION

The present invention relates to a light emitting diode (LED) device in which an LED is mounted as a light source, and more particularly relates to a light correction device.

There has been provided various LEDs which emit the three primary colors, white color, or intermediate colors in recent years, and the LED is used as a light source for the back light of the liquid crystal panel, for various display means such as a keyboard, indicator and others.

FIG. 14 is a sectional view of a conventional LED device. The LED device 110 comprises a substrate 102, connecting electrodes 103 and 104, and an LED 101 mounted on the substrate 102. A cathode 101c of the LED is connected to the electrode 103 with a conductive adhesive, and an anode 101a is connected to the electrode 104 by a wire 106. A protector 107 made of transparent resin is formed on the substrate 102 by molding to seal the LED 101, electrodes 103 and 104, and wire 106.

When an electric current is applied to the LED 101 through the electrodes 103 and 104, the LED emits light. The chromaticity of the emitted light 115 is dependent on the component of the LED. The component of the LED is adjusted so as to obtain desired chromaticity.

However, it is very difficult to manufacture an LED emitting light of desired chromaticity. This is caused by inequality of the wavelength of the emitted light, quantity of fluorescent material in the LED, and others. Such inequality is inevitable.

FIG. 15 is a chromaticity graph showing inequality in white light emitted from LEDs each of which is made so as to emit white light. If the proportion of red (R) is expressed by x, the proportion of green (G) is y, and the proportion of blue (B) is z, white light is as follows.

$$x+y+z=1 \quad (1)$$

In the graph, sign C0 shows a point where the ratio of R, G, B is 1:1:1 for white chromaticity. In the case, the coordinate is X=0.33, Y=0.33 and Z=0.33. However, actually the chromaticity of white LED is distributed in an area S surrounded by a dot line. An area S0 is practically regarded as a white range. An area S1 is intermediate color range of blue, area S2 is intermediate color of red, area S3 is green, and S4 is magenta.

It is difficult to select the LED included in the area S0 by measuring the chromaticity of a large number of LEDs. As a solution for the difficulty, the following method will be available.

1. Measuring chromaticity of a plurality of LEDs.
2. Classifying the LEDs into the areas S0, S1, S2, S3 and S4.
3. Applying classified LEDs to a field which requires the chromaticity. However, not always all areas are required, resulting in remaining of useless LEDs.

SUMMARY OF THE INVENTION

An object of the present invention is to provide an LED device having an LED the chromaticity of which is corrected to desired chromaticity.

According to the present invention, there is provided a light emitting diode device comprising a substrate, an LED mounted on the substrate, electrodes provided on the substrate and connected to the LED for applying a current to the LED, a protection made of a transparent material and sealing the LED, a color correcting material combined with the protector, the color correcting material having an effect of changing chromaticity of emitted light of the LED to desired chromaticity of illuminating light discharged from the LED device.

The chromaticity of the emitted light is in complementary color relationship with the chromaticity of the illuminating light.

In another aspect of the invention the color correcting material includes a fluorescent material for producing exciting light.

The color correcting material is formed into a film coated on the protector.

These and other objects and features of the present invention will become more apparent from the following detailed description with reference to the accompanying drawings.

DETAILED DESCRIPTION OF THE PREFERRED EMBODIMENT

Figure 1:
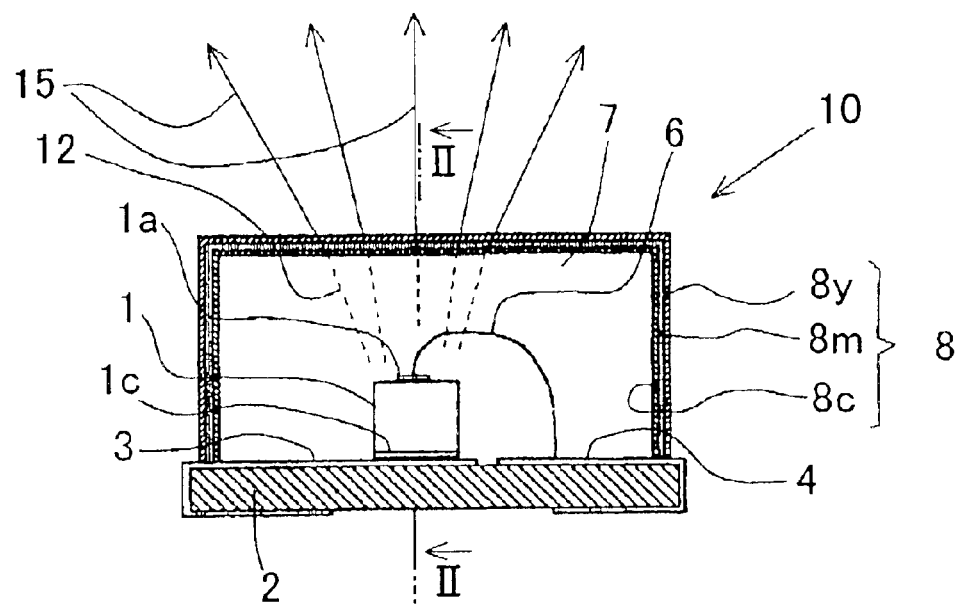
FIG. 1 is a sectional view of an LED device according to the present invention.

The LED device 10 comprises a substrate 2, connecting electrodes 3 and 4, and an LED 1 mounted on the substrate 2. A cathode 1c of the LED is connected to the electrode 3 with a conductive adhesive, and an anode 1a is connected to the electrode 4 by a wire 6. A protector 7 made of transparent resin is formed on the substrate 2 by molding to seal the LED 1, electrodes 3 and 4, and wire 6.

Figure 2:
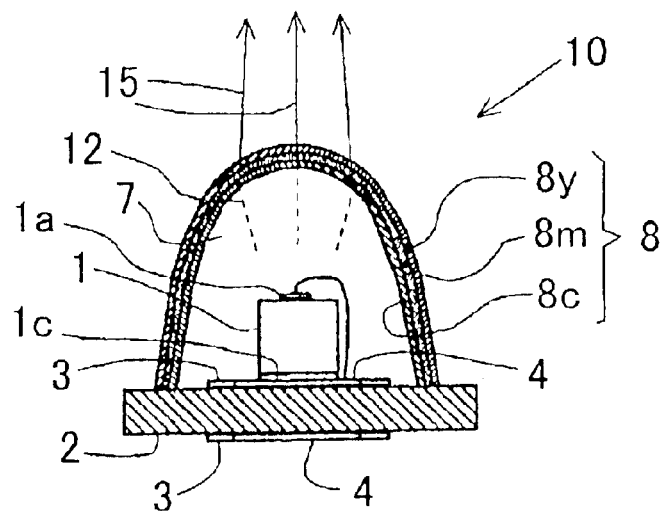
FIG. 2 is a sectional view taken along a line II—II of FIG. 1.

The substrate 2 has a rectangular shape in plan view, and the protector 7 has an arcuate peripheral wall as shown in FIG. 2, which is formed into a cylindrical lens having a condensing effect. A color filter 8 is coated on the periphery of the protector 7. The color filter 8 comprises three color layers comprising a cyan (C) layer 8c, a magenta (M) layer 8m and an yellow (Y) layer 8y.

When an electric current is applied to the LED 1 through the electrodes 3 and 4, the LED emits light. The chromaticity of the emitted light 12 is dependent on the component of the LED. The emitted light 12 passes through the color filter 8 so that the chromaticity of the emitted light 12 is converted into different chromaticity. The converted light is discharged from the color filter 8 as illuminating light 15.

If the chromaticity of the emitted light 12 is largely deviated from white, the chromaticity of the discharged light 15 is converted to white by the color filter 8 by setting the wavelength characteristic of the color filter as described hereinafter.

Figure 3:
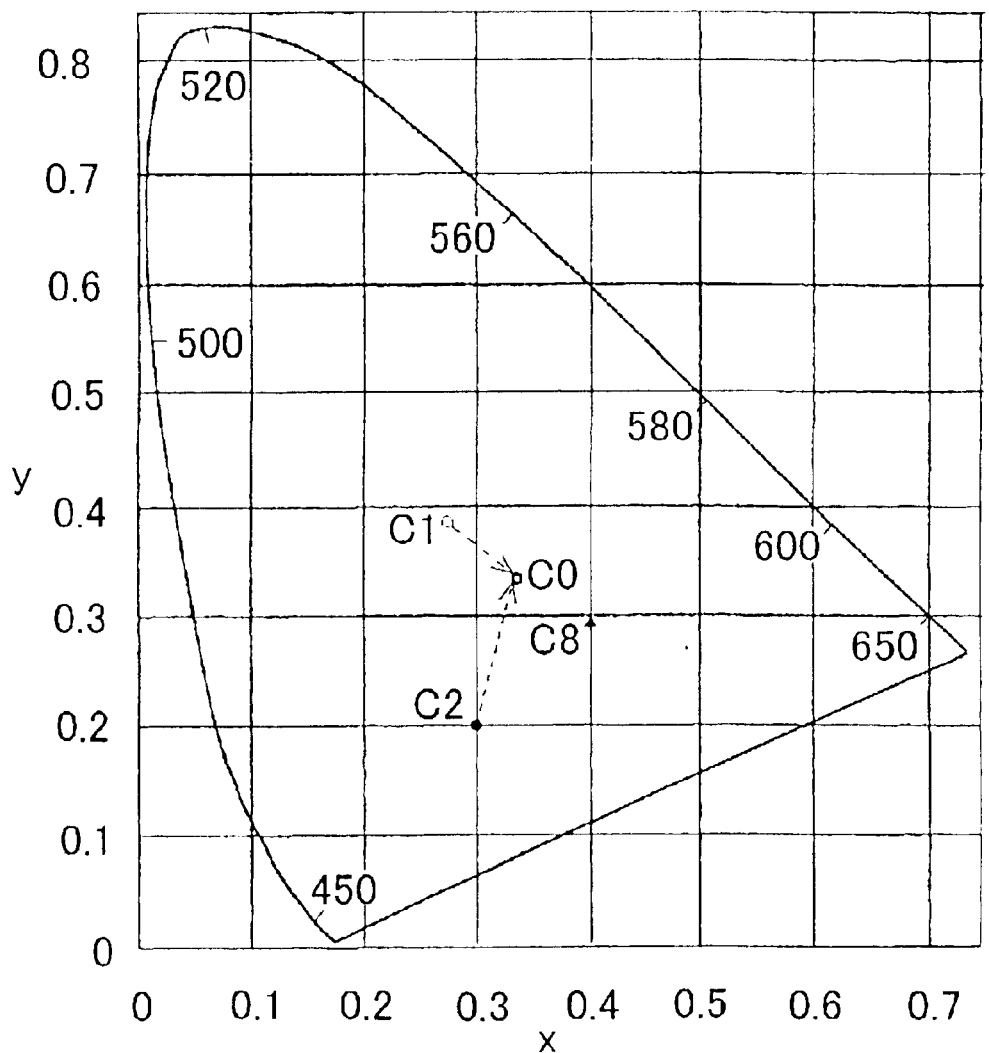
FIG. 3 is a graph showing characteristic of emitted light of an LED and chromaticity of illuminating light.
Figure 4:
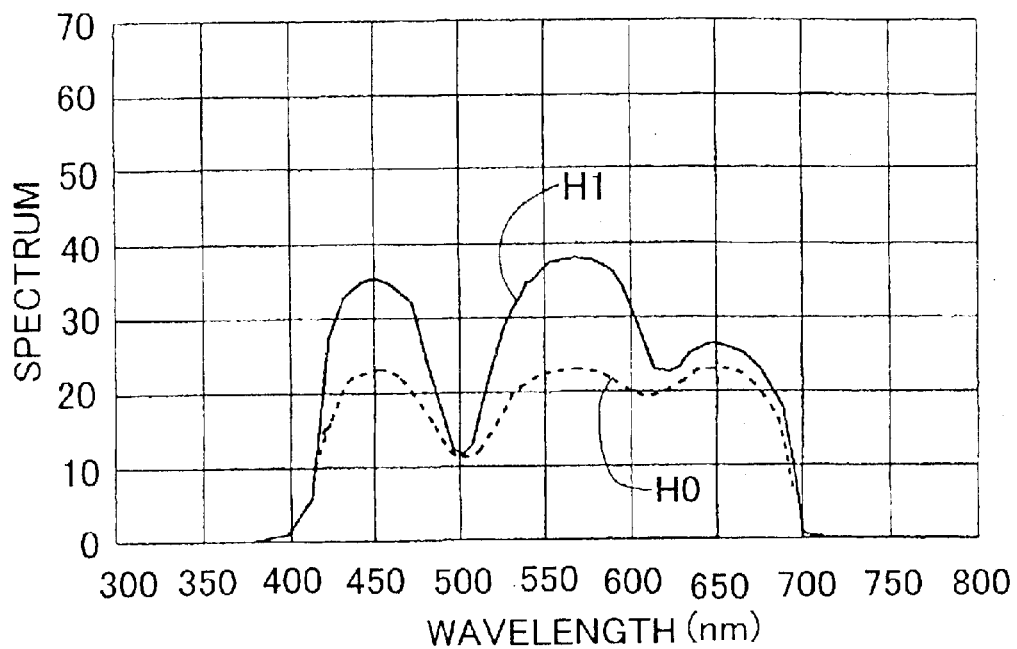
FIG. 4 is a graph showing wavelength spectrums of the emitted light and the illuminating light.
Figure 5:
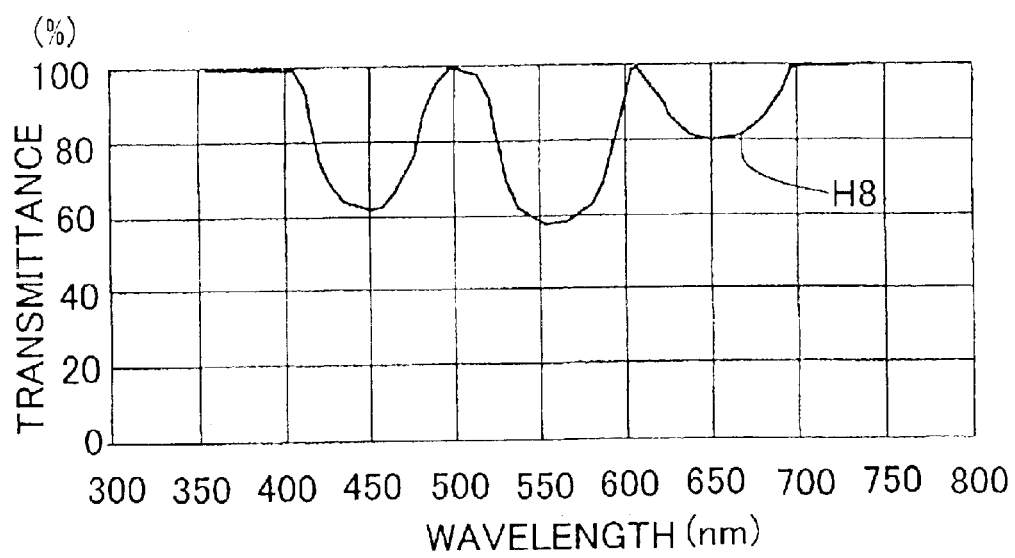
FIG. 5 is a graph showing a wavelength spectrum of the transmittance of a color filter.

FIG. 3 is a graph showing characteristic of emitted light of an LED and chromaticity of illuminating light, FIG. 4 is a graph showing wavelength spectrums of the emitted light and the illuminating light, FIG. 5 is a graph showing a wavelength spectrum of the transmittance of a color filter, FIGS. 6*a* to 6*d* are graphs showing wavelength spectrums of color layers of the color filter.

Steps of color correction method are as follows.

1. Measuring the wavelength spectrum (FIG. 4) of the emitted light 12, and obtaining the chromaticity C1 (FIG. 3) from the measured wavelength spectrum.

2. Calculating the wavelength spectrum of the transmittance of the color filter 8, which transmittance is for correcting the chromaticity C1 of the LED 1 to desired white of the chromaticity C0 of the illuminating light 15.

3. Calculating the wavelength spectrum of each of the color layers 8*c*, 8*m* and 8*y*, which wavelength spectrum is for realizing the obtained wavelength spectrum of the transmittance of the color filter 8.

4. Coating the color layers 8*c*, 8*m*, 8*y* on the protector 7 while controlling thickness of the layers in order that wavelength spectrums of the color layers 8*c*, 8*m*, 8*y* become the calculated values.

FIG. 3 shows the chromaticity of the emitted light 12 and the chromaticity of the illuminating light 15. FIG. 4 shows wavelength spectrums of the light 12 and the light 15. The wavelength spectrum H1 is the spectrum measured in the step 1. The ratio of the luminous intensity of R, G, B of the spectrum H1 is about as follows from FIG. 4.

$$R1{:}G1{:}B1=0.27{:}0.38{:}0.35 \quad (2)$$

From the formula 2, the coordinate of the chromaticity C1 of the emitted light 12 is x=0.27, y=0.38. This coordinate largely deviates from the coordinate C0 white.

In the step 2, the wavelength spectrum of the transmittance of the color filter 8 is calculated based on the wavelength spectrum of the emitted light 12 for the white correcting. Namely, the ratio of the luminous intensity of R, G, B of the illuminating light 15 for desired white light is as follows as shown by the spectrum H1 in FIG. 4.

$$R0{:}G0{:}B0=0.33{:}0.33{:}0.33 \quad (3)$$

If the ratio of the wavelength spectrum of the whole color filter 8 is R8:G8:B8, the ratio R8:G8:B8 is decided by calculating so as to complete the following formula (4) in accordance with the principle of the subtractive mixture of color stimuli.

$$R1{\times}R8{:}G1{\times}G8{:}B1{\times}B8=R0{:}G0{:}B0 \quad (4)$$

By substituting the formulas (2) and (3) for the formula (4), the following formula is formed.

$$0.27{\times}R8{:}0.38{\times}G8{:}0.35{\times}B8=0.33{:}0.33{:}0.33$$

From this formula, the following formula (5) is obtained.

$$R8:G8:B8 = 1.22:0.87:0.94 \quad (5)$$

$$= 0.4:0.29:0.31$$

Therefore, the coordinate of chromaticity C8 of the color filter 8 becomes x=0.4, y=0.29 as shown in FIG. 3. Here, FIG. 5 shows the spectrum H8 of transmittance of the whole color filter 8. The formula (5) can be expressed as follows.

$$R8{:}G8{:}B8=0.8{:}0.58{:}0.62 \quad (6)$$

Therefore the above described ratio of spectrum of the spectrum H8 becomes to the formula (6).

In order to realize the spectrum H8 (FIG. 5) of the transmittance of the color filter 8 obtained in the step 3, the ratio of the spectrum of transmittance of each of the color layers 8*c*, 8*m*, 8*y* is obtained by calculation. Here, the color layer 8*c* of cyan has transmission characteristic of transmitting G components and B components, but hardly transmitting R components. Consequently, the ratio of spectrum (R8*c*:G8*c*:B8*c*) is as follow.

$$R8c{:}G8c{:}B8c=r{:}1{:}1 \ (r<1)$$

Similarly, the ratio of spectrum of R, G, B of the color layer 8*m* of magenta is as follows.

$$R8m{:}G8m{:}B8m=1{:}m{:}1 \ (m<1)$$

The ratio of spectrum of R, G, B of the color layer 8*y* of yellow is as follows.

$$R8y{:}G8y{:}B8y=1{:}1{:}y \ (y<1)$$

As described above, generally each of spectrums of color layers 8*c*, 8*m*, 8*y* has all of components of R, G, B.

Therefore, since each of the color layers 8*c*, 8*m*, 8*y* transmits the component of R, G, B, transmitted light does not become black and has components of R, G, B, in the case that the color layers are superposed.

The present invention uses such a principle and sets the transmission characteristic of the color filter 8 to a desired value by the calculation.

More particularly, as described above, when the ratio of spectrum of the transmission characteristic of the color layer 8*c* is set to R8*c*, G8*c*, B8*c*, the ratio of spectrum of the color layer 8*m* is set to R8*m*, G8*m*, B8*m*, and ratio of spectrum of the color layer 8*y* to R8*y*, G8*y*, B8*y*, the ratio of spectrum of the all color filters 8 R8*y*:G8*y*:B8*y* is as follows.

$$R8{:}G8{:}B8=R8c{\times}R8m{\times}R8y+G8c{\times}G8m{\times}G8y+B8c{\times}B8m{\times}B8y \quad (7)$$

Substituting the formula (6) for the formula (7), $$0.8{:}0.58{:}0.62=R8c{\times}R8m{\times}R8y+G8c{\times}G8m{\times}G8y+B8c{\times}B8m{\times}B8y \quad (8)$$

Obtaining the ratio of spectrum of each color layer (transmittance R, G, B), $$R8c = 0.8 \quad R8m = 1 \quad R8y = 1 \quad (9)$$
$$G8c = 1 \quad G8m = 0.58 \quad G8y = 1$$
$$B8c = 1 \quad B8m = 1 \quad B8y = 0.62$$

Figure 6A:
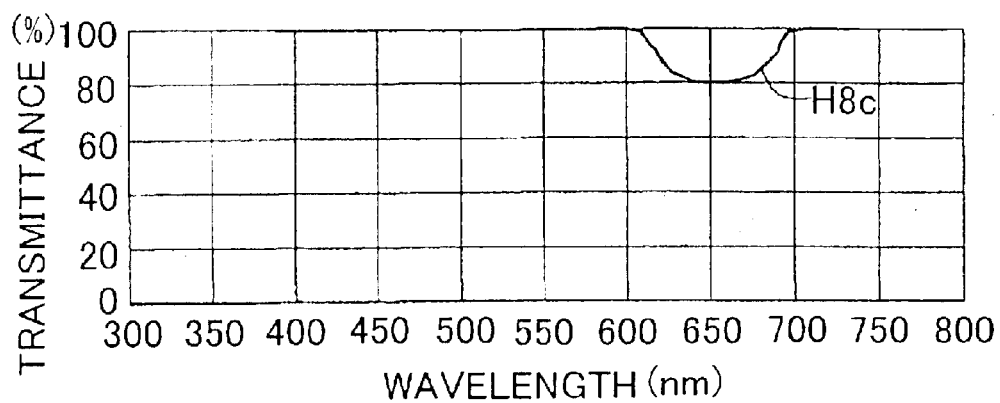
FIGS. 6a to 6d are graphs showing wavelength spectrums of color layers of the color filter.
Figure 6B:
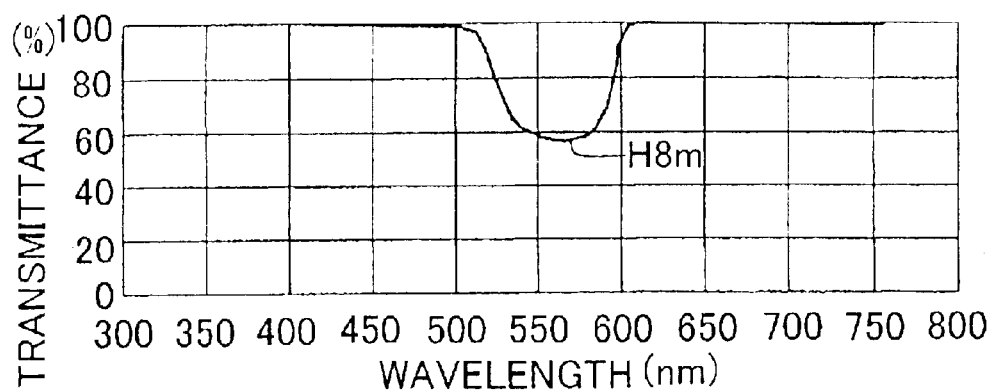
Figure 6C:
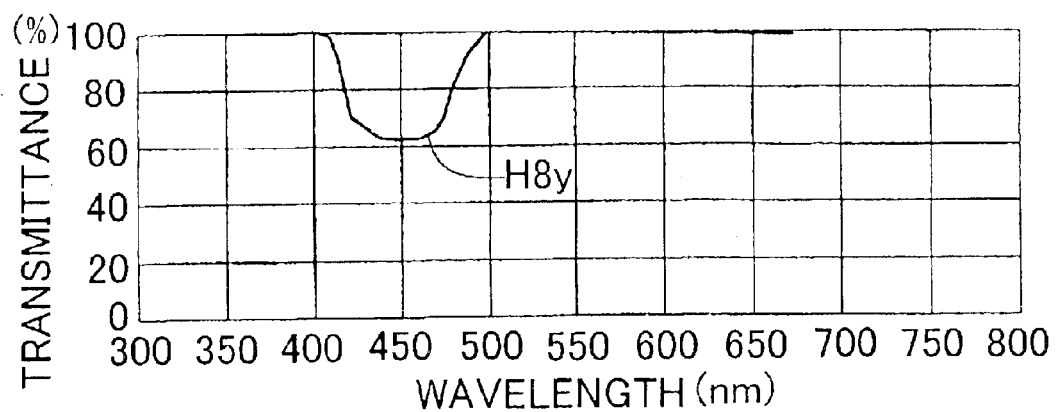
Figure 6D:
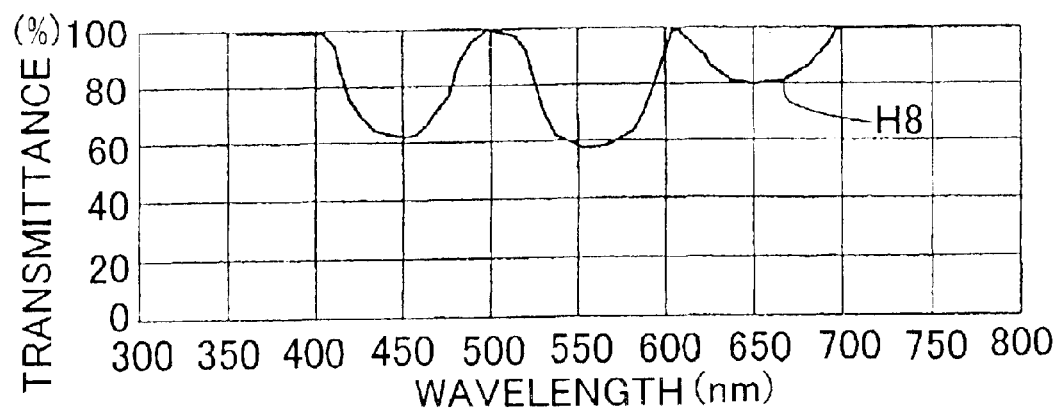

FIGS. 6*a* to 6*d* are graphs showing transmission characteristics corresponding to ratios of spectrum of color layers shown in the formula (9). FIG. 6*a* shows the transmission characteristic H8*c* of the color layer 8*c* of cyan, FIG. 6*b* shows the transmission characteristic H8*m* of the color layer 8m, FIG. 6c shows the transmission characteristic H8y of the color layer 8y. FIG. 6d shows the transmission characteristic H8 which is obtained by adding the transmission characteristic of FIGS. 6a, 6b and 6c. The transmission characteristic H8 coincides with the transmission characteristic H8 of FIG. 5.

In the step 4, the color layers 8c, 8m, 8y are formed by coating respective inks while controlling the thickness of the layers, so that each of the transmission characteristic of color layers 8c, 8m, 8y coincides with a value shown in the formula (9) and FIGS. 6a to 6d. In the case, final adjustment of thickness may be done while measuring the thickness. For example, when the thickness of the color layer 8c of cyan is gradually increased, unless the R component of transmitted light decreases. Therefore, the coating of the ink is performed little by little, until the R component of the transmitted light becomes 0.8 times of the initial value. Thus, the transmitted light can accurately be coincided with a desired chromaticity.

As described above, the inks are superimposed to form the color filter 8 so as to coincide the transmission characteristic of color layers 8c, 8m, 8y with calculated values. Thus, it is possible to coincide the transmission characteristic or chromaticity of the all color filters with desired values of the formula (6) or desired characteristic (C8 of FIG. 3). Therefore, when the emitted light 12 having the chromaticity C1 (FIG. 3) passes through the color filter 8, the emitted light 12 is corrected in chromaticity and discharged as the illuminating light 15 having the desired chromaticity C0 (FIG. 3) of while. Here, the chromaticity C8 of the color filter 8 and the chromaticity C1 of the emitted light 12 are in complementary color relation with each other in relation to the chromaticity C0 of white light of the illuminating light 15 (refer to formula (4)).

The present invention provides another device for producing an illumination light of an intermediate color other than white. Namely, when the coordinate of chromaticity CL of the emitted light 12 is set to x=xL, y=yL, z=zL, the coordinate of the chromaticity CS of the illuminating light 15 of a desired intermediate color is set to x=xs, y=ys, z=zs, and the coordinate of the chromaticity C8 of the color filter 8 necessary for the color correction is set to x=x8, y=y8, z=z8, there is the following relationship between these values of chromaticity based on the principle of the subtractive mixture of color stimuli.

$$xs:ys:zs = xL \times x8 : yL \times y8 : zL \times z8 \quad (10)$$

Therefore, the chromaticity CL of the emitted light 12 and the chromaticity C8 of the color filter 8 are in a relationship of complementary color in relation to the chromaticity CS of the white light of the illuminating light 15.

In the above described embodiment, although the color filter 8 has three color layers 8c, 8m and 8y, it is possible to provide one or two color layers. For example, in order to correct the R component only, only the color layer 8c of cyan is used. When the R component and G component are corrected, the color layer 8c of cyan and the color layer 8m of magenta are used. Furthermore, although the color filter 8 is provided on the protector 7 as a layer in the embodiment, particles or powders of color filter material may be mixed in the protector 7.

Figure 7:
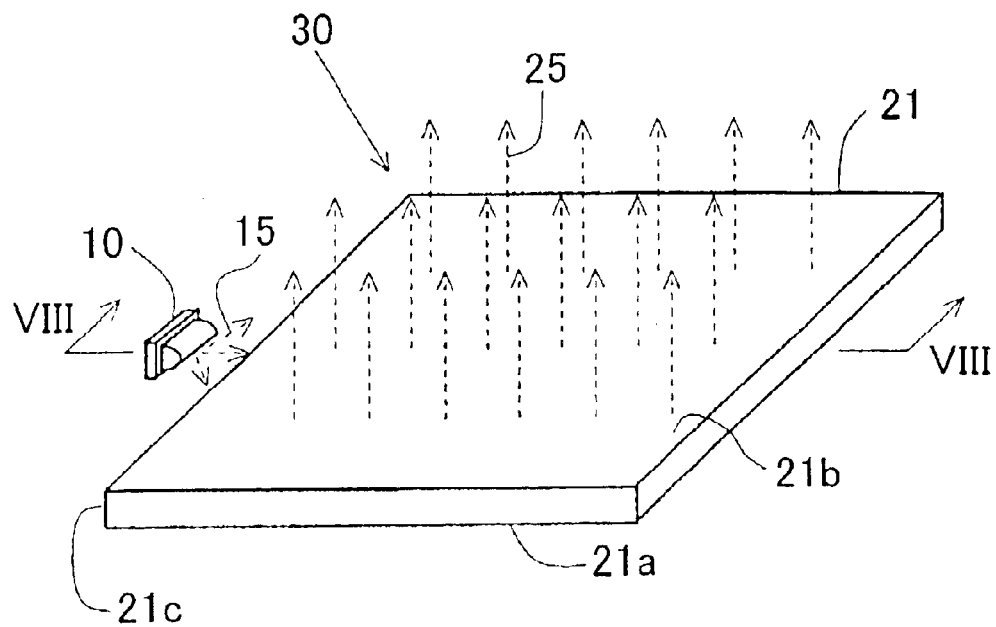
FIG. 7 is a perspective view showing an illuminating device by an edge light system.
Figure 8:
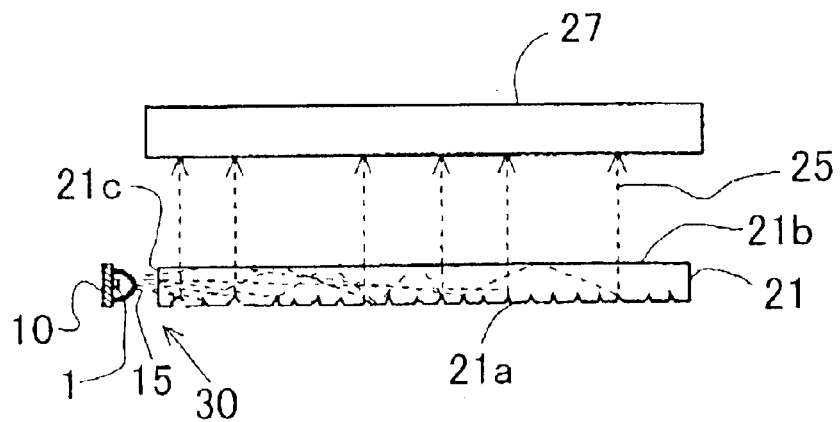
FIG. 8 is a sectional view taken along a line VIII—VIII of FIG. 7.

FIG. 7 is a perspective view showing an illuminating device by an edge light system, and FIG. 8 is a sectional view taken along a line VIII—VIII of FIG. 7.

The illuminating device 30 comprises a lighting panel 21 and the LED device 10 as an edge light. The lighting panel 21 made of a transparent resin has a light discharge surface 21b on the upper side thereof and a light diffusing surface 21a opposite the light discharge surface 21b. The light diffusing surface 21a has a plurality of prism ribs for reflecting the light from the LED device 10 to the light discharge surface 21b.

The LED device 10 is disposed at a front side 21c of the lighting panel 21. The illuminating light 15 discharged from the LED device 10 enters in the lighting panel 21 from the front side 21c, and is reflected by the diffusing surface 21a and discharged from the discharge surface 21b. The discharged light 25 illuminates a liquid crystal panel 27. The illuminating light 15 is discharged from the LED device 10, condensed by the condensing effect of the cylindrical lens of the protector 7, thereby effectively applying light to the lighting panel 21.

Figure 9:
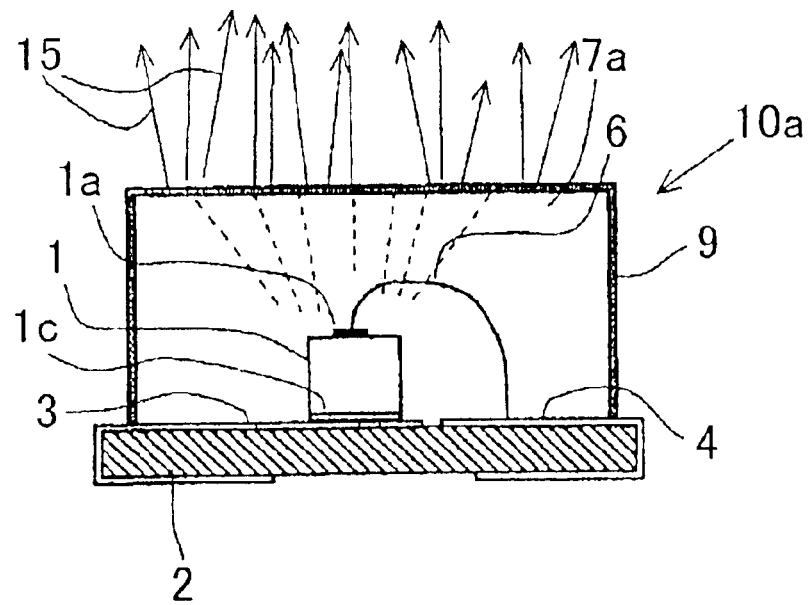
FIG. 9 is a sectional front view of a second embodiment of the present invention.
Figure 10:
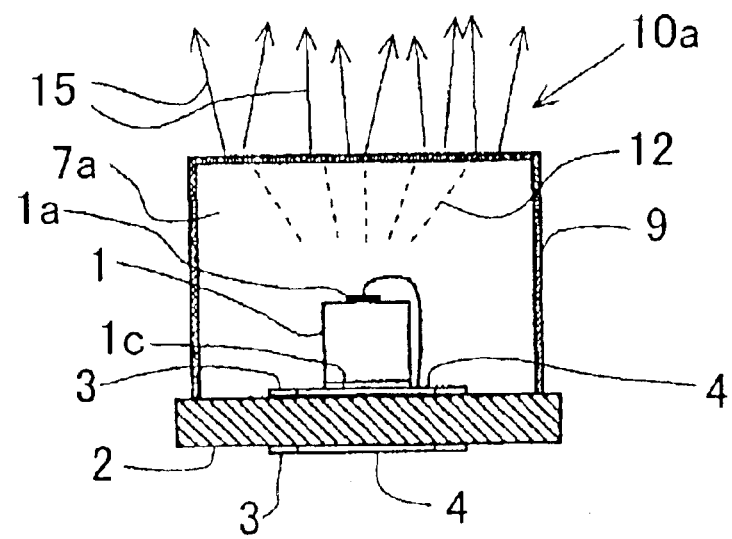
FIG. 10 is a sectional side view.

FIG. 9 is a sectional front view of a second embodiment of the present invention and FIG. 10 is a sectional side view.

An LED device 10a has the same composition as the first embodiment except for a protector 7a and a fluorescent paint film 9. Consequently, other parts are identified by same reference numerals as the first embodiment, omitting the explanation thereof.

The protector 7a has a rectangular parallelepiped. The florescent paint film 9 includes a fluorescent material which produces exciting light such as green (G), red (R) and yellow (Y) by light component of blue (B).

The chromaticity C2 of the emitted light 12 shown in FIG. 3 has a coordinate, for example, x=0.3, y=0.2, z=0.5.

Figure 11:
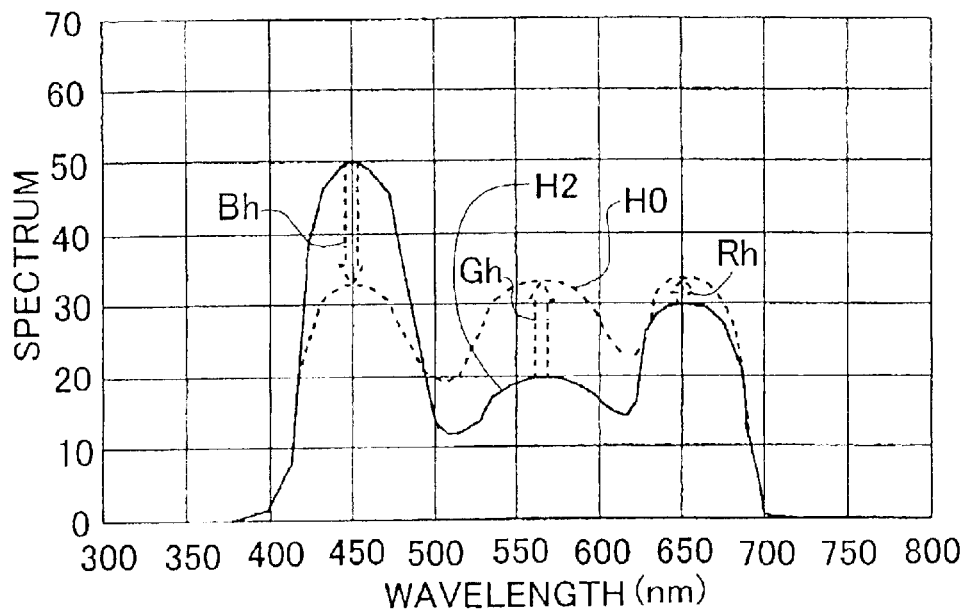
FIG. 11 shows a spectrum of the emitted light.

FIG. 11 shows a spectrum H2 of the emitted light 12. The ratio of components of R, G, B of the spectrum H2 is 0.3:0.2:0.5. As shown in FIG. 11, a part of the B component B of the spectrum H2 is absorbed by the fluorescent material in the fluorescent paint layer 9 by a spectrum of Bh. The G component increases by Gh by the excitation based on the absorption of the B component. The R component also increases by Rh. Thus, the spectrum H2 is corrected to white light of spectrum H0, the ratio of R, G, B being 0.33:0.33:0.33 and discharged as the illuminating light 15.

Figure 12:
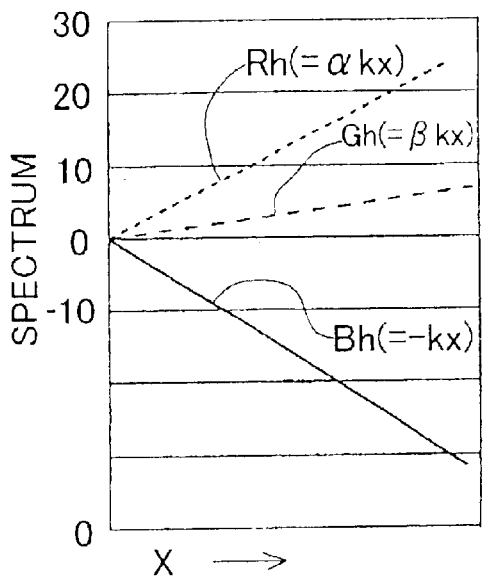
FIGS. 12 and 13 are graphs showing a principle of color correction.
Figure 13:
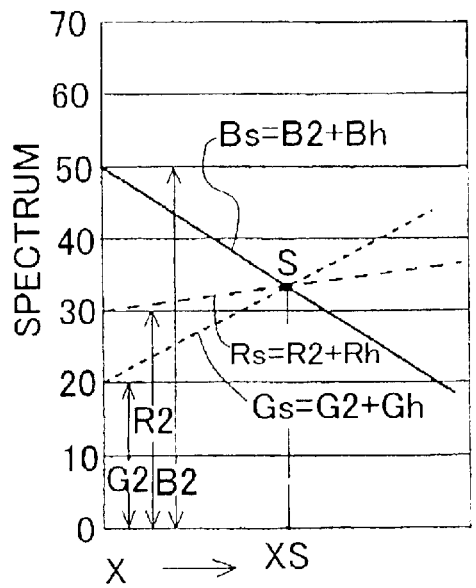
Figure 14:
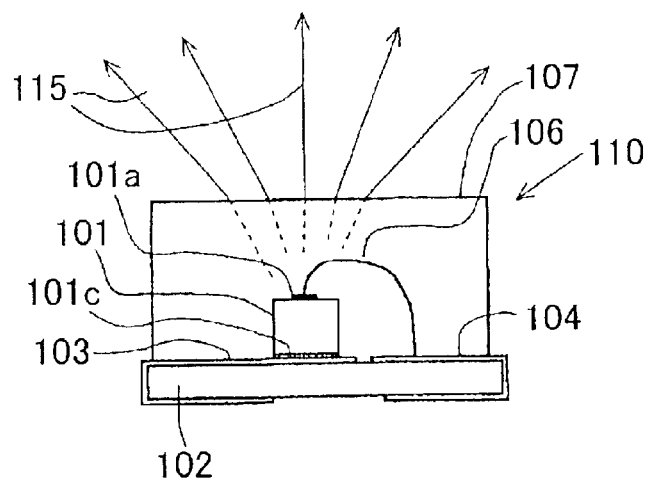
FIG. 14 is a sectional view of a conventional LED device.
Figure 15:
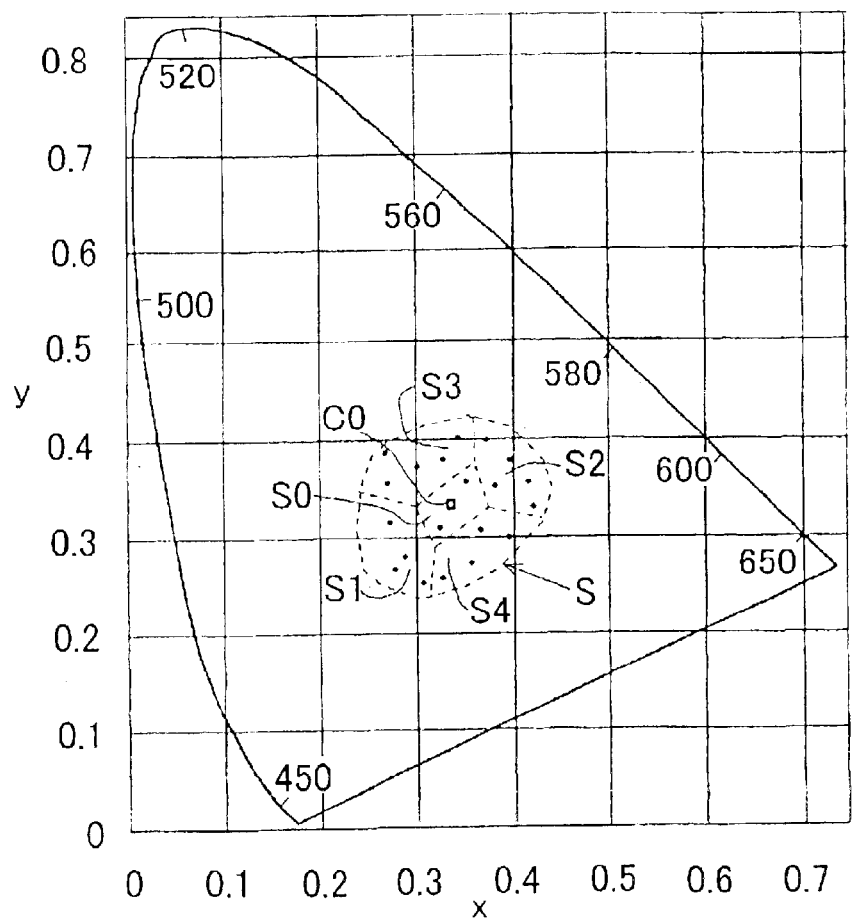
FIG. 15 is a chromaticity graph showing inequality in white light.

In FIG. 11, Rh=0.03, Gh=0.13 and Bh=−0.17. In order to set such values, following processes are taken. FIGS. 12 and 13 show variations of the spectrum variance Rh, Gh, Bh. Namely, if the thickness of the film 9 is expressed by x and x=0, Rh becomes 0, Gh becomes 0 and Bh becomes 0. However, as x increases, Bh decreases at inclination −k, Rh increases at inclination αk, Gh increases at inclination βk.

Therefore, such a thickness as becoming Bh=−0.17 is expressed by xs, and the values α and β are preliminarily set so as to become Rh=0.03, Gh=0.13 at thickness xs. This setting is possible by properly adjusting the kind and component ratio of fluorescent material for producing the exciting light G, R, Y included in the fluorescent paint film 9. As a result, corrected spectrum component Rs, Gs, Bs become Rs=0.33, Gs=0.33, Bs=0.33 as white light as shown in FIG. 13.

In simple expression, these values are obtained by adding the correction components Rh, Gh, Bh to R2, G2, B2 (FIG. 13) which are components of the emitted light 12. In other words, the principle of the second embodiment is, as shown in FIGS. 11 and 13, to correct color into desired chromaticity by adding and mixing spectrum components Rh, Gh, Bh generated at the fluorescent paint film 9 to R2, G2 B2 of the components of the spectrum H2. Therefore, by properly selecting the component ratio of the fluorescent material and the thickness of the fluorescent paint film 9, not only the correction for white, but also the correction for intermediate colors are possible. Since the second embodiment performs correction of color by addition, the corrected illuminating light can be maintained at high luminous intensity.

In accordance with the present invention, the chromaticity of the light emitted from the LED can be corrected into a desired chromaticity. In addition, it is possible to uniform chromaticity of the emitted light, thereby increasing quality of the illuminating light.

While the invention has been described in conjunction with preferred specific embodiment thereof, it will be understood that this description is intended to illustrate and not limit the scope of the invention, which is defined by the following claims.

What is claimed is:

1. A light emitting diode device comprising:

a substrate;

an LED mounted on the substrate;

electrodes provided on the substrate and connected to the LED for applying a current to the LED;

an encapsulating resin encapsulating the LED; and a color filter layer provided on the encapsulating resin, the color filter layer comprising three color layers, wherein the three color layers comprise a cyan layer, a magenta layer and a yellow layer.

* * * * *